(12) United States Patent
Kikkawa

(10) Patent No.: US 8,466,029 B2
(45) Date of Patent: Jun. 18, 2013

(54) COMPOUND SEMICONDUCTOR DEVICE AND MANUFACTURING METHOD OF THE SAME

(75) Inventor: Toshihide Kikkawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/185,946

(22) Filed: Jul. 19, 2011

(65) Prior Publication Data

US 2011/0275199 A1 Nov. 10, 2011

Related U.S. Application Data

(60) Division of application No. 12/210,442, filed on Sep. 15, 2008, now Pat. No. 8,344,419, which is a continuation of application No. PCT/JP2006/305265, filed on Mar. 16, 2006.

(51) Int. Cl.
  *H01L 21/336* (2006.01)
(52) U.S. Cl.
  USPC ............ 438/285; 438/779; 257/E29.246; 257/E29.249
(58) Field of Classification Search
  USPC ............ 438/285, 779; 257/E29.246, E29.249
  See application file for complete search history.

(56) References Cited

U.S. PATENT DOCUMENTS

| | | | |
|---|---|---|---|
| 5,986,209 A | 11/1999 | Tandy | |
| 6,940,090 B2 | 9/2005 | Saito et al. | |
| 7,102,179 B2 | 9/2006 | Saito et al. | |
| 7,244,974 B2 | 7/2007 | Saito et al. | |
| 2003/0020092 A1 | 1/2003 | Parikh et al. | |
| 2004/0227211 A1 | 11/2004 | Saito et al. | |
| 2005/0087765 A1 | 4/2005 | Saito et al. | |
| 2005/0263844 A1 | 12/2005 | Saito et al. | |
| 2006/0019435 A1 | 1/2006 | Sheppard et al. | |

FOREIGN PATENT DOCUMENTS

| | | |
|---|---|---|
| JP | 2002-141499 A | 5/2002 |
| JP | 2002-359256 A | 12/2002 |
| JP | 2004-342907 A | 12/2004 |
| WO | 2006-001369 A1 | 1/2006 |

OTHER PUBLICATIONS

European Search report dated Jun. 24, 2009, issued in corresponding European Patent Application No. 06729258.
European Office Action dated Feb. 3, 2010, issued in corresponding European Patent Application No. 06729258.1.
Extended European Search Report dated Feb. 22, 2010, issued in corresponding European Patent Application No. 09178271.
Kikkawa T. et al.; Surface-charge controlled AlGaN/GaN-Power HFET without current collapse and gm dispersion; International Digest. washington, D.C., Dec. 2-5, 2001: NY: IEEE, US, Dec. 2, 2001, pp. 25.4.1-25.4.4.

(Continued)

*Primary Examiner* — Julio J Maldonado
*Assistant Examiner* — Amar Movva
(74) *Attorney, Agent, or Firm* — Westerman, Hattori, Daniels & Adrian, LLP

(57) ABSTRACT

An AlN layer (2), a GaN buffer layer (3), a non-doped AlGaN layer (4a), an n-type AlGaN layer (4b), an n-type GaN layer (5), a non-doped AlN layer (6) and an SiN layer (7) are sequentially formed on an SiC substrate (1). At least three openings are formed in the non-doped AlN layer (6) and the SiN layer (7), and a source electrode (8a), a drain electrode (8b) and a gate electrode (19) are evaporated in these openings.

7 Claims, 18 Drawing Sheets

OTHER PUBLICATIONS

Partial European Search Report dated Feb. 22, 2010, issued in corresponding European Patent Application No. 09178269.8.
International Search Report of PCT/JP2006/305265, mailing dated Jun. 13, 2006.
Notification of Transmittal of Translation of the International Preliminary Report on Patentability (Form PCT/IB/338) of International Application No. PCT/JP2006/305265 mailed Sep. 9, 2008 with Form PCT/ISA/237.
U.S. Office Action dated May 14, 2012, issued in corresponding U.S. Appl. No. 13/185,888.

COMPOUND SEMICONDUCTOR DEVICE AND MANUFACTURING METHOD OF THE SAME

CROSS-REFERENCE TO RELATED APPLICATIONS

This application is a Divisional of U.S. application Ser. No. 12/210,442, filed on Sep. 15, 2008, which in turn is a Continuation of International Application No. PCT/JP2006/305265, with an international filing date of Mar. 16, 2006, which designated the United States of America, the entire contents of which are incorporated herein by reference.

FIELD

The present invention relates to a compound semiconductor device suitable for a high electron mobility transistor (HEMT) and so on and a manufacturing method thereof.

BACKGROUND

In recent years, a development of an electronic device (a compound semiconductor device) is vigorous in which a GaN layer and an AlGaN layer are formed sequentially on a substrate composed of sapphire, SiC, GaN, Si, or the like, and the GaN layer is used as an electron transit layer. A bandgap of GaN is 3.4 eV, and it is larger than that of GaAs of 1.4 eV. Accordingly, an operation in high withstand voltage is expected for the compound semiconductor device.

A high-voltage operation is required for a base station amplifier of a cellular phone system, and a high withstand voltage is essential requirement thereof. At present, a value over 300 V is reported as a withstand voltage when current is turned off. There is a case when a change in on-resistance during operation called as a current collapse occurs in the above-stated compound semiconductor device. This phenomenon can be avoided by disposing a GaN protective layer on an AlGaN electron supply layer, and further forming an SiN protective film. The structure as stated above is described in, for example, Japanese Patent Application Laid-open No. 2002-359256.

FIG. 1 is a sectional view showing a structure of a conventional compound semiconductor device. An AlN layer 102, a GaN layer 103, an n-type AlGaN layer 104a, an n-type AlGaN layer 104b and an n-type GaN layer 105 are sequentially formed on an SiC substrate 101. A thickness of the AlN layer 102 is 150 μm. A total thickness of the n-type AlGaN layer 104b and the n-type GaN layer 105 is approximately 30 nm. Further, an SiN layer 107 is formed on the n-type GaN layer 105. Plural openings are formed at the SiN layer 107, and a source electrode 108a, a drain electrode 108b and a gate electrode 109 are evaporated in these openings.

But, this compound semiconductor device is a normally-on type. There is a case when a compound semiconductor device is used for automobile parts. Current continues to flow in the automobile parts when a car goes out of order resulting from a traffic accident and so on when the compound semiconductor device is the normally-on type. Accordingly, a demand for a normally-off type compound semiconductor device becomes high in recent times.

It is necessary to make a threshold voltage positive to realize the normally-off type compound semiconductor device. Accordingly, a recess gate structure is proposed. However, it is difficult to manufacture a compound semiconductor device in the recess gate structure with high accuracy. This is because a selective etching suitable for processing each semiconductor layer constituting the compound semiconductor device has not been found, and instead, a time-controlled dry etching is performed.

Besides, in the conventional compound semiconductor device shown in FIG. 1, a positive gate leakage current flows in a saturation region as input power is made large. This is because the gate electrode 109 and the n-type GaN layer 105 are in contact directly. It is difficult to continue to use in a saturation power state if the gate leak current as stated above flows, and it is hard to say that it is suitable for the base station amplifier of the cellular phone.

Accordingly, a structure in which an insulator layer is sandwiched between the n-type GaN layer 105 and the gate electrode 109 is proposed. However, when the insulator layer exists, the gate leak current decreases, but the threshold voltage becomes deep. Accordingly, it is considered that the threshold voltage cannot be made positive with this structure. Further, the withstand voltage decreases though the gate leak current is reduced. This is caused by an influence of a trap between the insulator layer and the n-type GaN layer 105.

SUMMARY

In a compound semiconductor device according to an aspect of the present invention, a GaN based carrier transit layer is formed on a semiconductor substrate, a GaN based carrier supply layer is formed on the carrier transit layer, a GaN based protective layer is formed on the carrier supply layer, and a source electrode, a drain electrode and a gate electrode are formed on the protective layer. Besides, a compound semiconductor layer containing nitrogen and positioning between the gate electrode and the source electrode, and between the gate electrode and the drain electrode, is formed on the protective layer, and an insulator layer is formed on the compound semiconductor layer.

In a manufacturing method of a compound semiconductor device according to an aspect of the present invention, a GaN based carrier transit layer is formed on a semiconductor substrate, and thereafter, a GaN based carrier supply layer is formed on the carrier transit layer. Next, a GaN based protective layer is formed on the carrier supply layer. Subsequently, a compound semiconductor layer containing nitrogen is formed on the protective layer. After that, an insulator layer is formed on the compound semiconductor layer. Subsequently, an opening for a source electrode, an opening for a drain electrode and an opening for a gate electrode are formed in the insulator layer and the compound semiconductor layer. Next, electrodes are formed in the three openings. In forming the opening for a gate electrode, wet etching of the compound semiconductor layer is performed until the protective layer exposes.

Additional objects and advantages of the invention will be set forth in part in the description which follows, and in part will be obvious from the description, or may be learned by practice of the invention. The object and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

DESCRIPTION OF EMBODIMENTS

Hereinafter, embodiments of the present invention are concretely described with reference to the attached drawings.

First Embodiment

Figure 2:
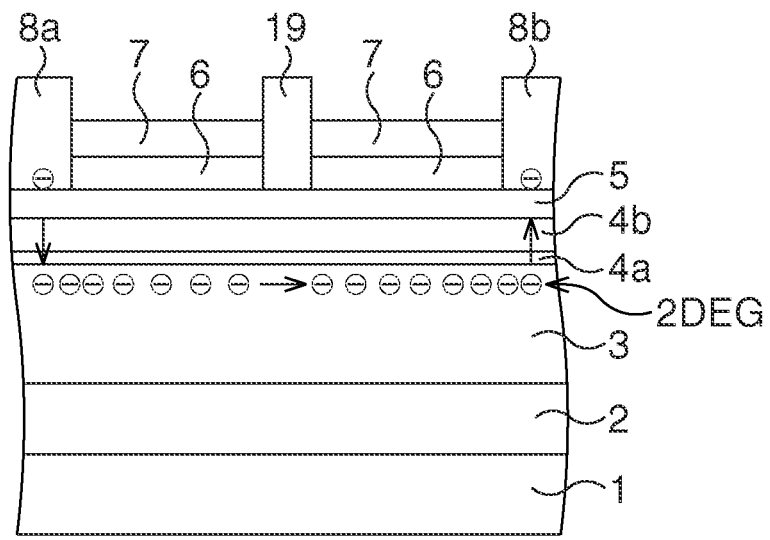
FIG. 2 is a sectional view showing a structure of a compound semiconductor device according to a first embodiment of the present invention.

First, a first embodiment of the present invention is described. FIG. 2 is a sectional view showing a structure of a compound semiconductor device according to the first embodiment of the present invention.

In the first embodiment, an AlN layer 2 with a thickness of approximately 150 nm to 300 nm is formed on an SiC substrate 1. A GaN buffer layer 3 (a carrier transit layer) with a thickness of approximately 3 μm is formed on the AlN layer 2. A non-doped AlGaN layer 4a with a thickness of approximately 5 nm is formed on the GaN buffer layer 3. An n-type AlGaN layer 4b (a carrier supply layer) with a thickness of approximately 15 nm to 20 nm is formed on the non-doped AlGaN layer 4a. The n-type AlGaN layer 4b is doped with Si at approximately $4 \times 10^{18}$ cm$^{-3}$. Further, an n-type GaN layer 5 (a protective layer) with a thickness of approximately 7 nm is formed on the n-type AlGaN layer 4b. The n-type GaN layer 5 is doped with Si at approximately $5 \times 10^{18}$ cm$^{-3}$. A non-doped AlN layer 6 with a thickness of approximately 3 nm and an SiN layer 7 with a thickness of approximately 20 nm are sequentially formed on the n-type GaN layer 5. A semiconductor-insulator junction exists between the non-doped AlN layer 6 and the SiN layer 7. At least three openings (for a source electrode, for a drain electrode and for a gate electrode) are formed in the non-doped AlN layer 6 and the SiN layer 7, and a source electrode 8a, a drain electrode 8b and a gate electrode 19 are evaporated in these openings. A semiconductor-metal junction exists between the non-doped AlN layer 6 and the gate electrode 19. Besides, a metal-semiconductor junction exists between the gate electrode 19 and the n-type GaN layer 5. The source electrode 8a and the drain electrode 8b may be composed of, for example, a Ta film with a thickness of approximately 10 nm and an Al film with a thickness of approximately 300 nm formed thereon. Besides, the gate electrode 19 may be composed of, for example, an Ni film and an Au film formed thereon.

In the first embodiment as stated above, a piezoelectric effect resulting from a lattice mismatch occurs in a vicinity of an interface of the non-doped AlGaN layer 4a with the GaN buffer layer 3. Accordingly, positive polarization charges appear, and electrons are induced in the vicinity of the interface of the GaN buffer layer 3 with the non-doped AlGaN layer 4a. As a result, a two-dimensional electron gas (2DEG) appears.

Besides, the SiN layer 7 exists at a periphery of the gate electrode 19 as an insulator layer, and therefore, it is possible to prevent a gate leak current from a side surface. Accordingly, a high withstand voltage is realized.

Further, the non-doped AlN layer 6 exists between the SiN layer 7 and the n-type GaN layer 5, and therefore, electrons exist at an interface between the non-doped AlN layer 6 and the n-type GaN layer 5. Accordingly, a lot of two-dimensional electron gas exists at an electron transit region between the gate electrode 19 and the source electrode 8a and the drain electrode 8b. Consequently, a transconductance (Gm) improves, and on-resistance is suppressed to be low. Besides, a threshold voltage approximates to "0" (zero) V more closely because a gate recess structure is adopted. Namely, it becomes possible to secure the enough current while approximating the threshold voltage to "0" (zero) V owing to these interactions.

Next, a manufacturing method of the compound semiconductor device according to the first embodiment is described. FIG. 3A to FIG. 3G are sectional views showing the manufacturing method of the compound semiconductor device according to the first embodiment of the present invention in process sequence.

Figure 3A:
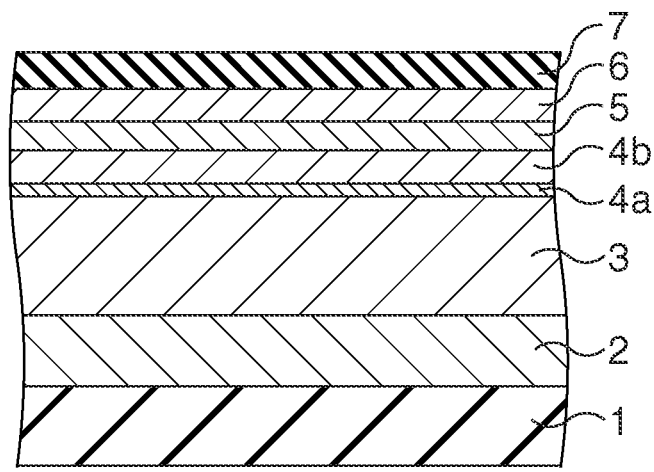
FIG. 3A to 3G are sectional views showing a manufacturing method of the compound semiconductor device according to the first embodiment of the present invention in process sequence.

First, the AlN layer 2 is formed on the SiC substrate 1, as shown in FIG. 3A. Next, the GaN buffer layer 3 is formed on the AlN layer 2. Subsequently, the non-doped AlGaN layer 4a is formed on the GaN buffer layer 3. After that, the n-type AlGaN layer 4b is formed on the non-doped AlGaN layer 4a. Subsequently, the n-type GaN layer 5 is formed on the n-type AlGaN layer 4b. Next, the non-doped AlN layer 6 is formed on the n-type GaN layer 5. Next, the SiN layer 7 is formed on the non-doped AlN layer 6. The formations of the AlN layer 2, the GaN buffer layer 3, the non-doped AlGaN layer 4a, the n-type AlGaN layer 4b, the n-type GaN layer 5 and the non-doped AlN layer 6 may be performed by, for example, a crystal growth method such as an MOCVD method. Besides, the formation of the SiN layer 7 may be performed by, for example, a plasma CVD method.

Figure 3B:
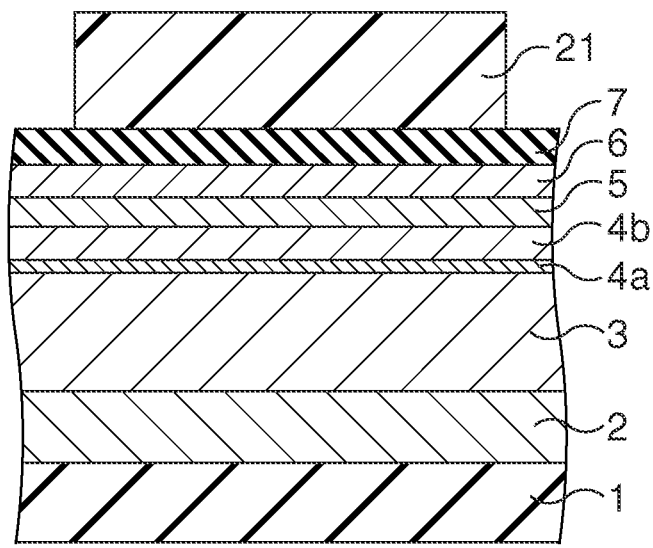

Next, a resist pattern 21 having openings at regions where the source electrode 8a and the drain electrode 8b are to be formed is formed on the SiN layer 7, as shown in FIG. 3B.

Figure 3C:
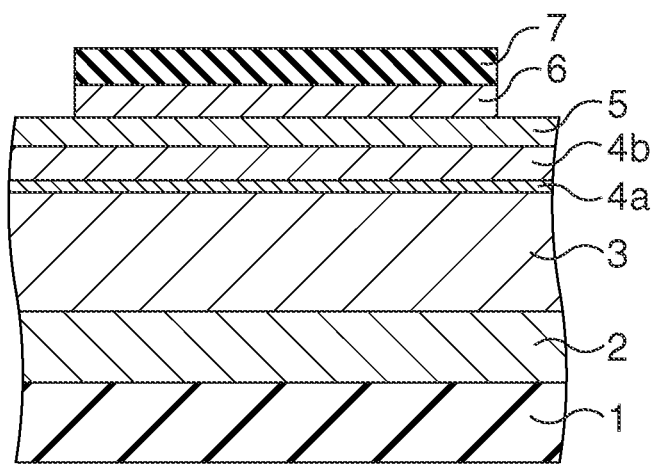

Subsequently, wet etching of the SiN layer 7 and the non-doped AlN layer 6 is performed by using the resist pattern 21 as a mask, and thereby, the opening for the source electrode and the opening for the drain electrode are formed in the SiN layer 7 and the non-doped AlN layer 6, as shown in FIG. 3C. At this time, the n-type GaN layer 5 positioning under the non-doped AlN layer 6 is not removed by the wet etching, and therefore, the etching is stopped at a surface of the n-type GaN layer 5. The resist pattern 21 is removed after the openings are formed.

Figure 3D:
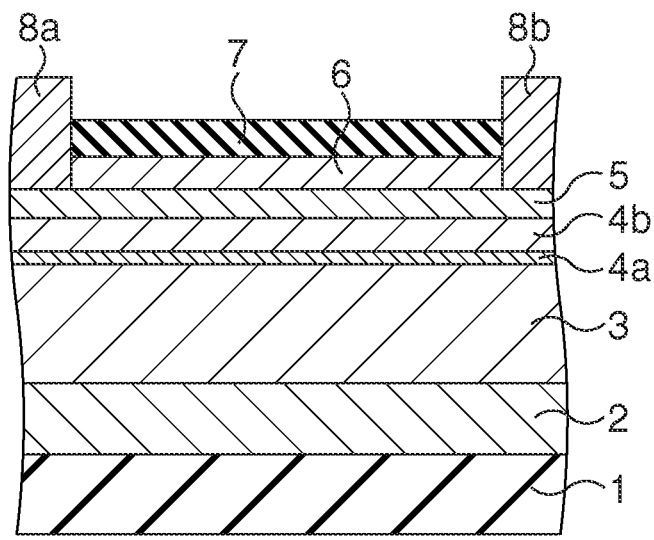

After that, the source electrode 8a and the drain electrode 8b are evaporated in the openings in the SiN layer 7 and the non-doped AlN layer 6, as shown in FIG. 3D. The n-type GaN layer 5 might be removed before evaporating the source electrode 8a and the drain electrode 8b by the dry etching using the reactive ion etching (RIE) method. $Cl_2$ is used as the etching gas in this case. Etching time is 25 sec to remove the GaN layer 5.

Figure 3E:
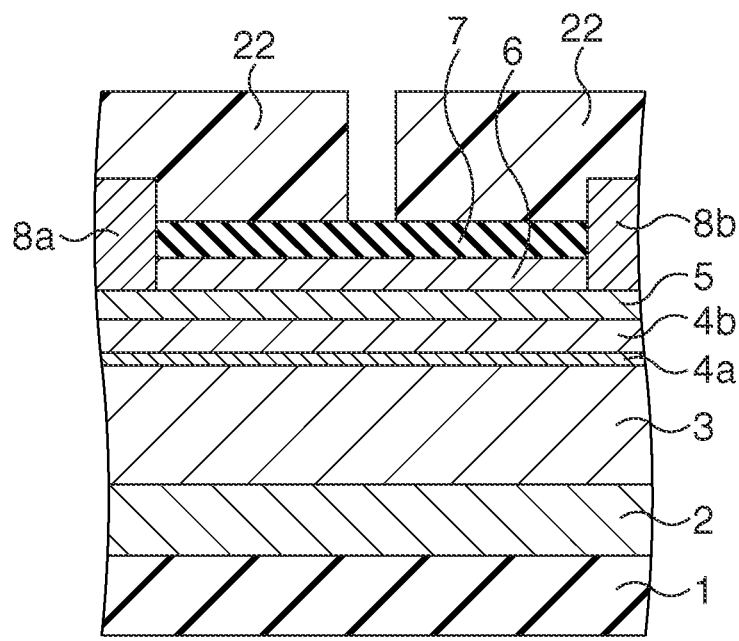

Subsequently, a resist pattern 22 having an opening at a region where the gate electrode 19 is to be formed is formed on the SiN layer 7, the source electrode 8a and the drain electrode 8b, as shown in FIG. 3E.

Figure 3F:
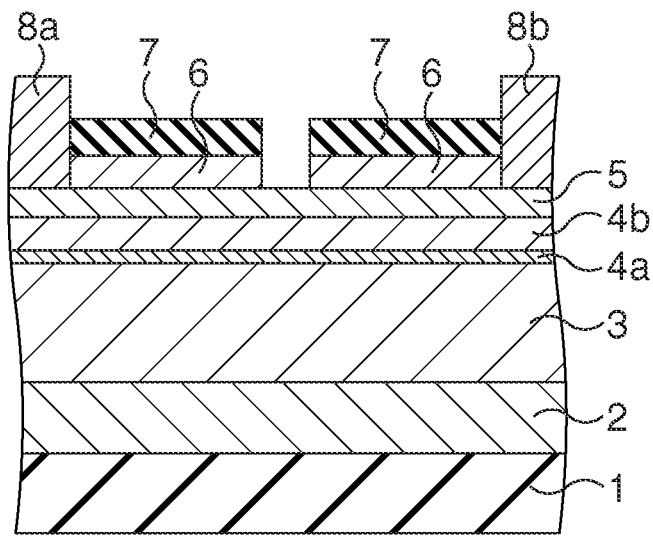

Next, wet etching (etching using acid) of the SiN layer 7 and the non-doped AlN layer 6 is performed by using the resist pattern 22 as a mask, and thereby, the opening for the gate electrode is formed in the SiN layer 7 and the non-doped AlN layer 6, as shown in FIG. 3F. At this time also, the n-type GaN layer 5 positioning under the non-doped AlN layer 6 is not removed by the wet etching, and therefore, the etching is stopped at the surface of the n-type GaN layer 5. The resist pattern 22 is removed after the opening is formed.

Figure 3G:
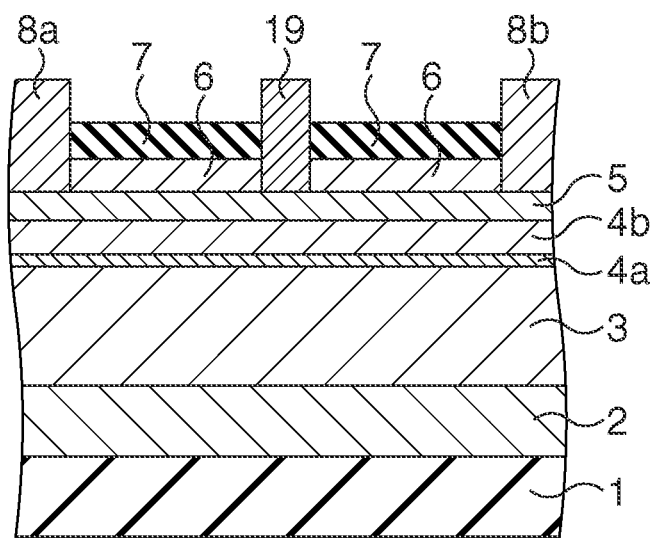

Subsequently, the gate electrode 19 (an embedded gate electrode) is evaporated in the opening in the SiN layer 7 and the non-doped AlN layer 6, as shown in FIG. 3G. Incidentally, element isolation can be performed by, for example, ion-implantation, though it is not shown.

According to the manufacturing method as stated above, a selection ratio between the non-doped AlN layer 6 and the n-type GaN layer 5 at the wet etching is high, and therefore, it is possible to process the non-doped AlN layer 6 with high accuracy.

Accordingly, it is possible to form the gate electrode 19 having good reproducibility with high accuracy.

Figure 1:
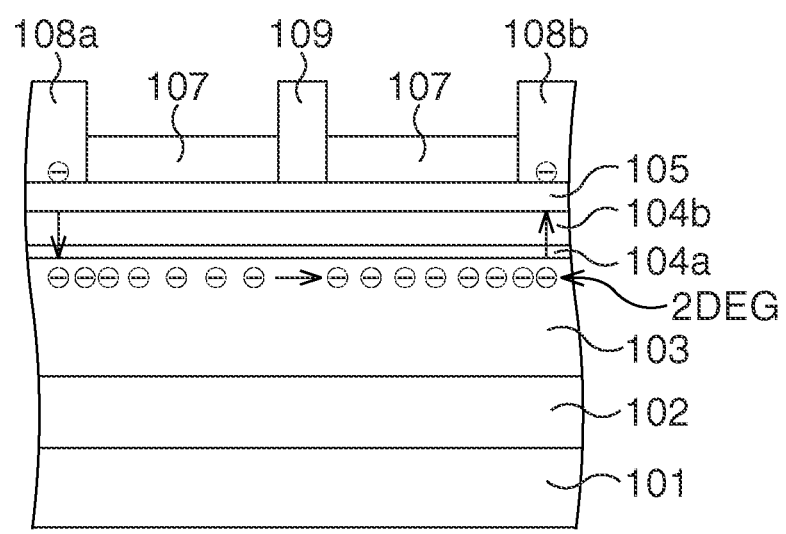
FIG. 1 is a sectional view showing a structure of a conventional compound semiconductor device.
Figure 4:
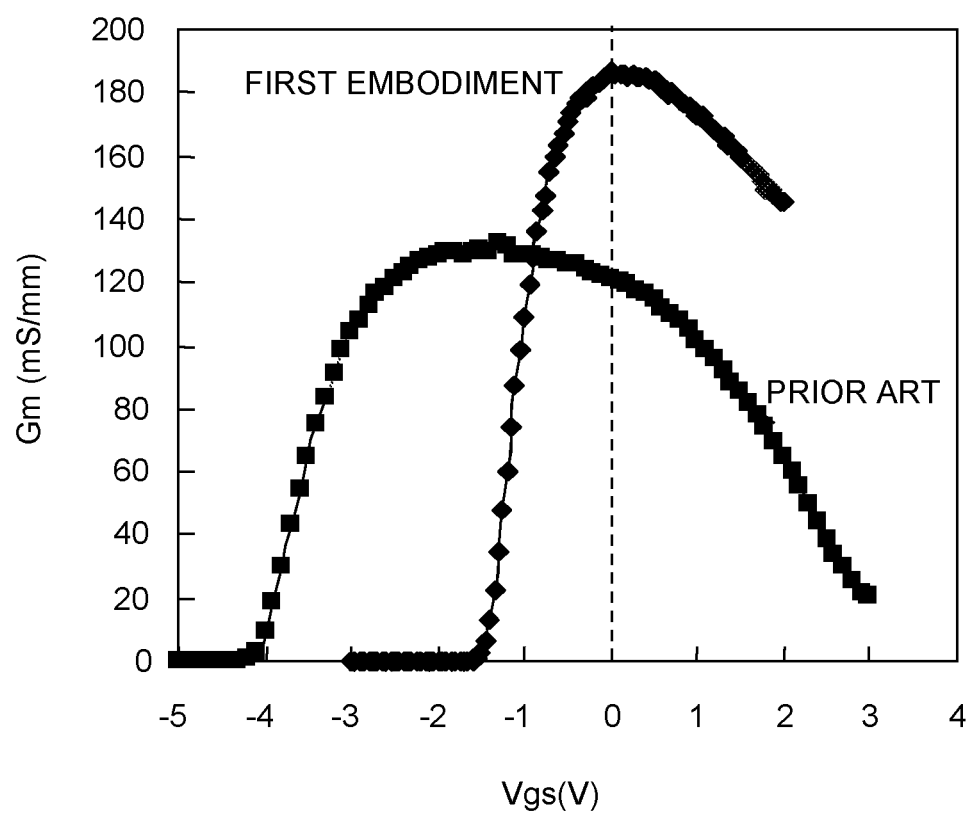
FIG. 4 is a graphic chart showing a device characteristic of the compound semiconductor device according to the first embodiment of the present invention.

Here, a device characteristic of the compound semiconductor device manufactured by the present inventor in accordance with the above-stated method is described. FIG. 4 is a graphic chart showing the device characteristic of the compound semiconductor device according to the first embodiment measured by the present inventor. A device characteristic of the conventional compound semiconductor device shown in FIG. 1 is also shown in FIG. 4 for the purpose of reference. A horizontal axis is a voltage between gate-source (Vgs), and a vertical axis is a transconductance (Gm). As shown in FIG. 4, the threshold voltage approximates to "0" (zero) V more closely in the first embodiment compared to the conventional compound semiconductor device.

Figure 5:
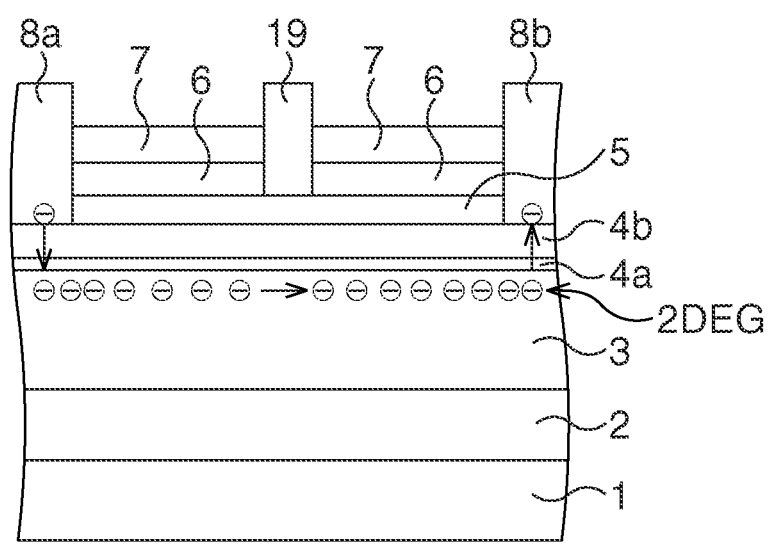
FIG. 5 is a sectional view showing a modification example of the first embodiment of the present invention.

Incidentally, in the first embodiment, bottom surfaces of the source electrode 8a and the drain electrode 8b are in contact with the surface of the n-type GaN layer 5, but they may be in contact with a surface of the n-type AlGaN layer 4b as shown in FIG. 5. In this case, for example, the opening for the source electrode and the opening for the drain electrode are formed in the SiN layer 7 and the non-doped AlN layer 6 by using the resist pattern 21 shown in FIG. 3B as the mask, and thereafter, a dry etching of the n-type GaN layer 5 is performed while remaining the resist pattern 21. In the dry etching, a reactive ion etching (RIE) is performed, for example, with a pressure of 2 Pa, a $Cl_2$ flow rate of 10 sccm, and an etching speed of 10 nm/min. An end point of the dry etching may be determined by, for example, a time control. Incidentally, an error of an etching amount is preferable to be within ±3 nm. In this case also, the source electrode 8a and the drain electrode 8b may be composed of, for example, a Ta film with a thickness of approximately 10 nm and an Al film with a thickness of approximately 300 nm formed thereon. The structures of the electrodes and the periphery thereof as stated above can be applied to the following embodiments. The purpose of removing the GaN layer 5 is improving the ohmic contact from $1 \times 10^5$ Ωcm to $1 \times 10^6$ Ωcm.

Second Embodiment

Figure 6:
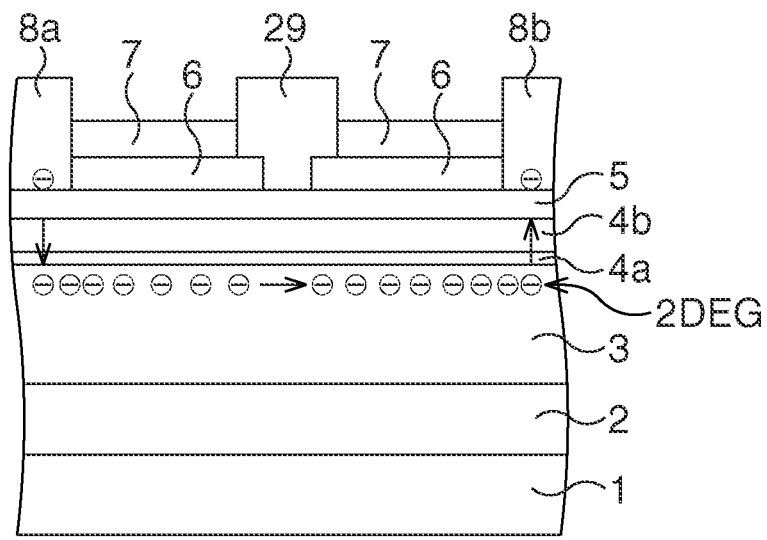
FIG. 6 is a sectional view showing a structure of a compound semiconductor device according to a second embodiment of the present invention.

Next, a second embodiment of the present invention is described. FIG. 6 is a sectional view showing a structure of a compound semiconductor device according to the second embodiment of the present invention.

In the second embodiment, although a size of the opening for the gate electrode of the non-doped AlN layer 6 is approximately equal to that of the first embodiment, the opening for the gate electrode of the SiN layer 7 is wider than that of the first embodiment. A gate electrode 29 having an overhang portion is embedded in the opening. The other structure is the same as the first embodiment.

According to the second embodiment as stated above, an electric field concentration in a vicinity of an interface between the gate electrode 29 and the non-doped AlN layer 6 is reduced than the electric field concentration in a vicinity of an interface between the gate electrode 19 and the non-doped AlN layer 6 in the first embodiment. There is a case when a voltage of 50 V to 500 V is applied between the gate and drain in the compound semiconductor device, but according to the second embodiment, deterioration hardly occurs furthermore even in the case as stated above.

Figure 7A:
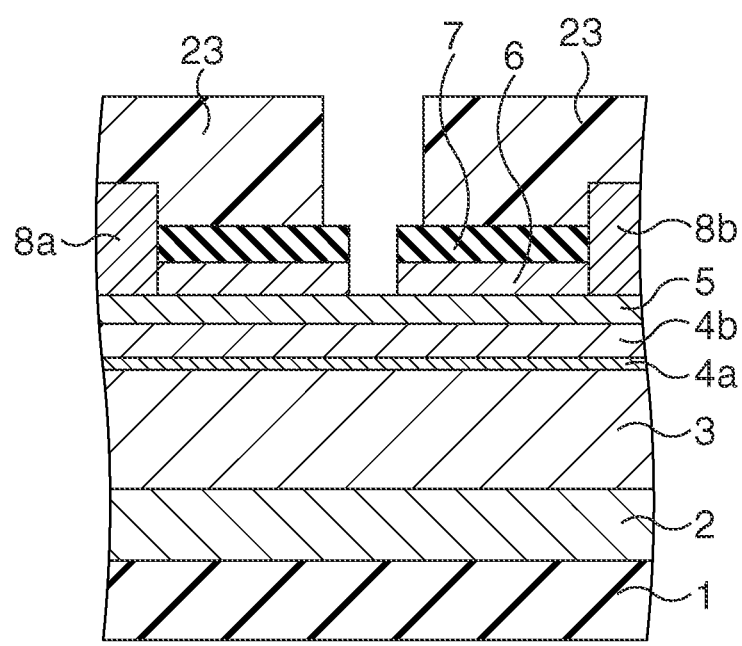
FIGS. 7A to 7C are sectional views showing a manufacturing method of the compound semiconductor device according to the second embodiment of the present invention in process sequence.
Figure 7B:
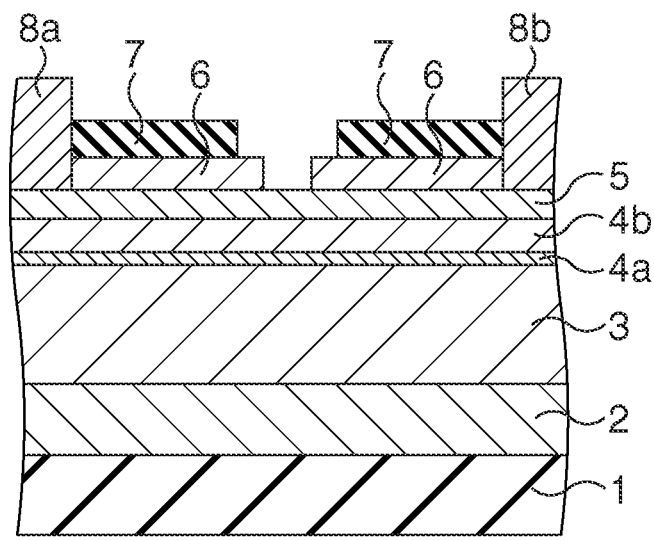
Figure 7C:
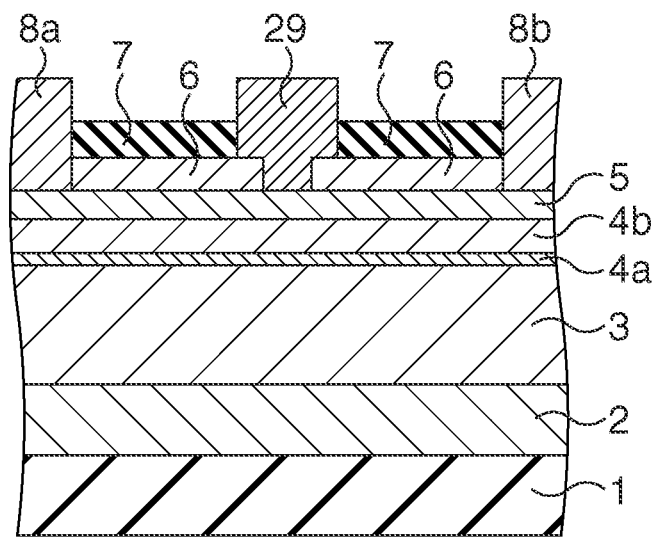

Next, a manufacturing method of the compound semiconductor device according to the second embodiment is described. FIG. 7A to FIG. 7C are sectional views showing the manufacturing method of the compound semiconductor device according to the second embodiment of the present invention in process sequence.

First, the processes until the removal of the resist pattern 22 (refer to FIG. 3F) are performed as same as the first embodiment. Next, a resist pattern 23 having an opening at a region where the overhang portion of the gate electrode 29 is to be formed is formed on the SiN layer 7, the source electrode 8a and the drain electrode 8b, as shown in FIG. 7A.

Next, wet etching of the SiN layer 7 is performed by using the resist pattern 23 as a mask, and thereby, the opening for the overhang portion is formed in the SiN layer 7, as shown in FIG. 7B. The resist pattern 23 is removed after the opening is formed.

Subsequently, the gate electrode 29 (an embedded gate electrode) is evaporated in the opening in the SiN layer 7 and the non-doped AlN layer 6, as shown in FIG. 7C. Incidentally, element isolation can be performed by, for example, ion-implantation, though it is not shown.

Figure 8:
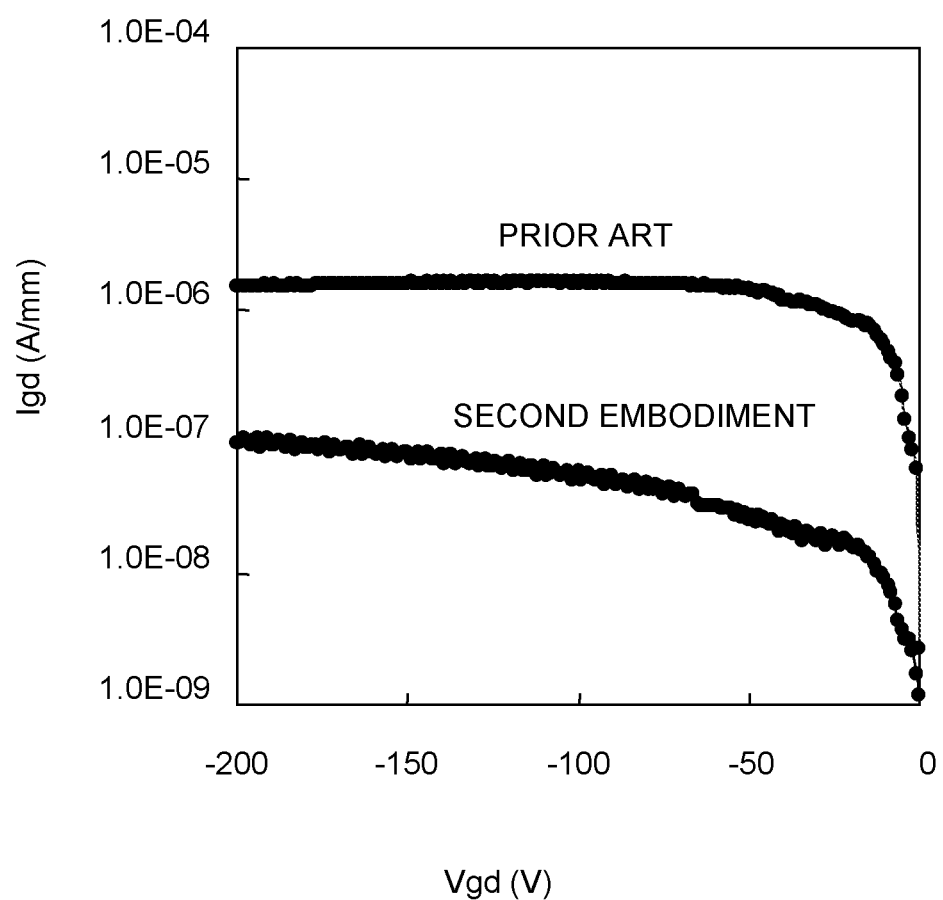
FIG. 8 is a graphic chart showing a device characteristic of the compound semiconductor device according to the second embodiment of the present invention.

Here, a device characteristic of the compound semiconductor device manufactured by the present inventor in accordance with the above-stated method is described. FIG. 8 is a graphic chart showing the device characteristic of the compound semiconductor device according to the second embodiment measured by the present inventor. In FIG. 8, a device characteristic of the conventional compound semiconductor device shown in FIG. 1 is also shown for the purpose of reference. A horizontal axis is a voltage between gate-drain (Vgd), and a vertical axis is a current between gate-drain (Igd). As shown in FIG. 8, a backward gate leak current decreases in the second embodiment compared to the conventional compound semiconductor device. Further, the threshold voltage approximates to "0" (zero) V without decreasing saturation current.

Third Embodiment

Figure 9:
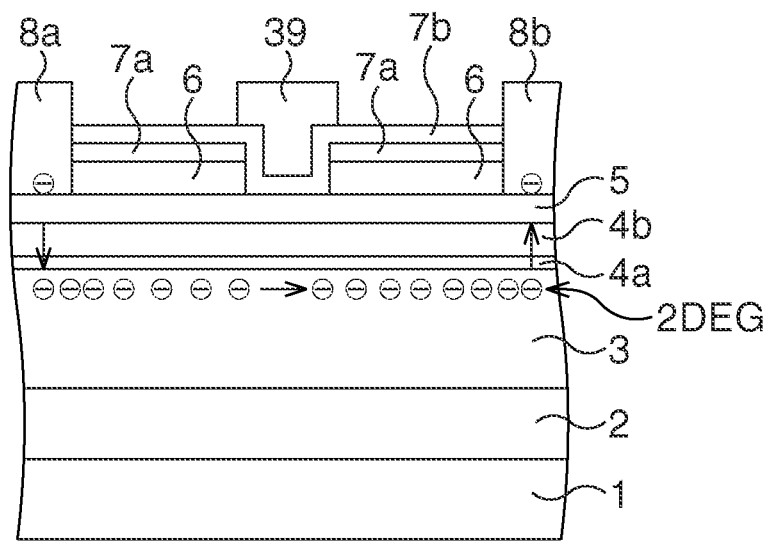
FIG. 9 is a sectional view showing a structure of a compound semiconductor device according to a third embodiment of the present invention.

Next, a third embodiment of the present invention is described. In the third embodiment, an MIS (Metal-Insulator-Semiconductor) structure is adopted. FIG. 9 is a sectional view showing the structure of a compound semiconductor device according to the third embodiment of the present invention.

In the third embodiment, an SiN layer 7a with a thickness of approximately 10 nm is formed on the non-doped AlN layer 6. At least three openings (for a source electrode, for a drain electrode and for a gate electrode) are formed in the non-doped AlN layer 6 and the SiN layer 7a. In the present embodiment, an SiN layer 7b with a thickness of approximately 10 nm is formed in the opening for the gate electrode among the three openings, and on the SiN layer 7a. A gate electrode 39 having an overhang portion is evaporated in the opening for the gate electrode. The other structure is the same as the first embodiment.

According to the third embodiment as stated above, a forward gate leak current can be drastically reduced. Besides, a complete normally-off operation can be performed. Besides, it becomes possible to obtain high current because the normally-off operation is realized.

Next, a manufacturing method of the compound semiconductor device according to the third embodiment is described. FIG. 10A to FIG. 10E are sectional views showing the manufacturing method of the compound semiconductor device according to the third embodiment of the present invention in process sequence.

Figure 10A:
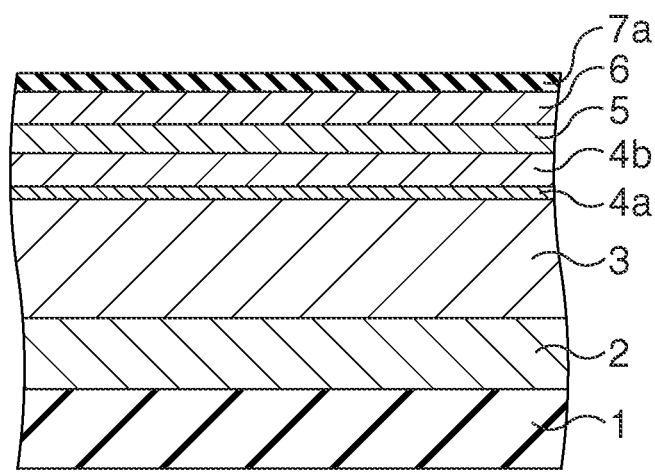
FIGS. 10A to 10E are sectional views showing a manufacturing method of the compound semiconductor device according to the third embodiment of the present invention in process sequence.

First, the processes until the formation of the non-doped AlN layer 6 (refer to FIG. 3A) are performed as same as the first embodiment. Next, the SiN layer 7a is formed on the non-doped AlN layer 6, as shown in FIG. 10A. The formation of the SiN layer 7a may be performed by, for example, a plasma CVD method.

Figure 10B:
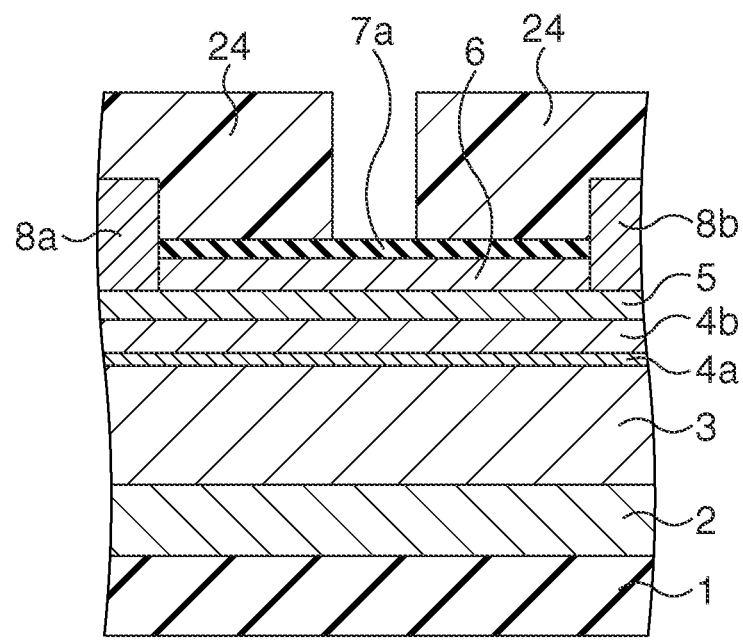

Next, the processes until the formations of the source electrode 8a and the drain electrode 8b (refer to FIG. 3D) are performed as same as the first embodiment. After that, a resist pattern 24 having an opening at a region where a lower portion of the gate electrode 39 is to be formed is formed on the SiN layer 7a, the source electrode 8a and the drain electrode 8b, as shown in FIG. 10B.

Figure 10C:
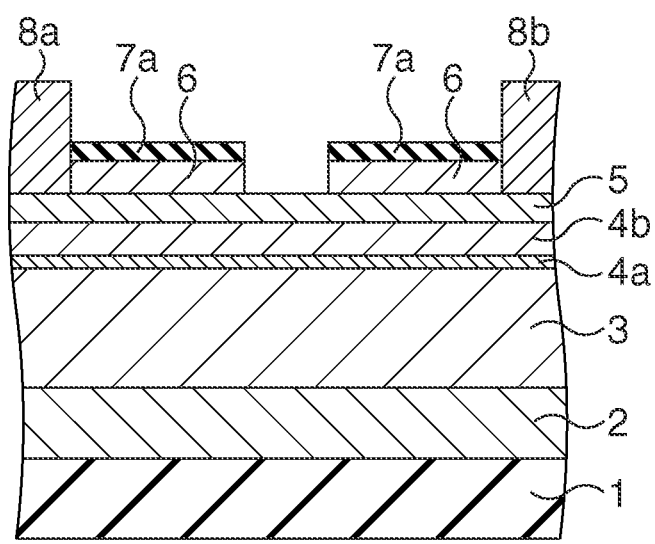

Subsequently, wet etching of the SiN layer 7a and the non-doped AlN layer 6 is performed by using the resist pattern 24 as a mask, and thereby, the opening for the gate electrode is formed in the SiN layer 7a and the non-doped AlN layer 6, as shown in FIG. 10C. At this time, the n-type GaN layer 5 positioning under the non-doped AlN layer 6 is not removed by the wet etching, and therefore, the etching is stopped at the surface of the n-type GaN layer 5. The resist pattern 24 is removed after the opening is formed.

Figure 10D:
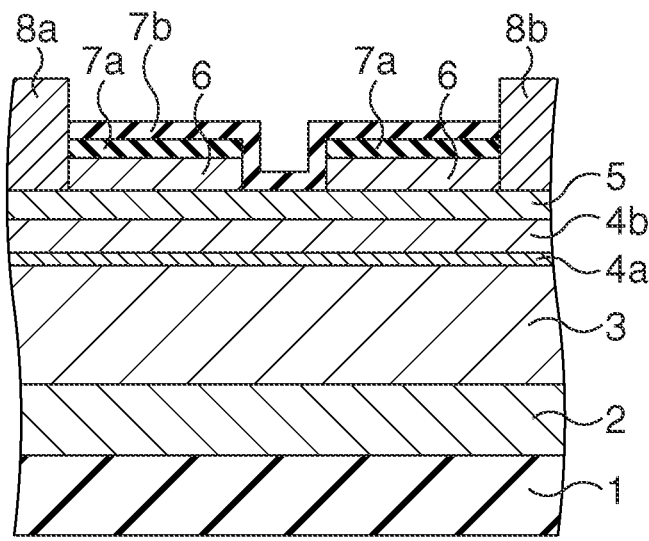

Next, the SiN layer 7b is formed in the opening for the gate electrode and on the SiN layer 7a, as shown in FIG. 10D. The formation of the SiN layer 7b may be performed by, for example, a plasma CVD method.

Figure 10E:
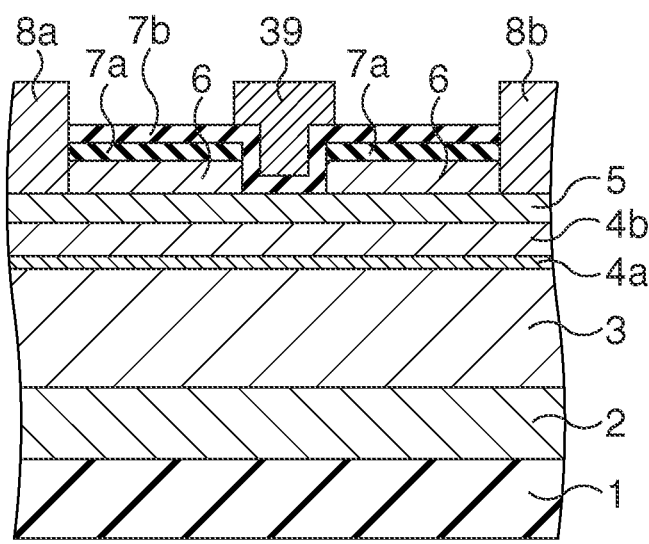

Subsequently, the gate electrode 39 (an embedded gate electrode) is evaporated in the opening in the SiN layer 7a and the non-doped AlN layer 6, as shown in FIG. 10E. Incidentally, element isolation can be performed by, for example, ion-implantation, though it is not shown.

Figure 11:
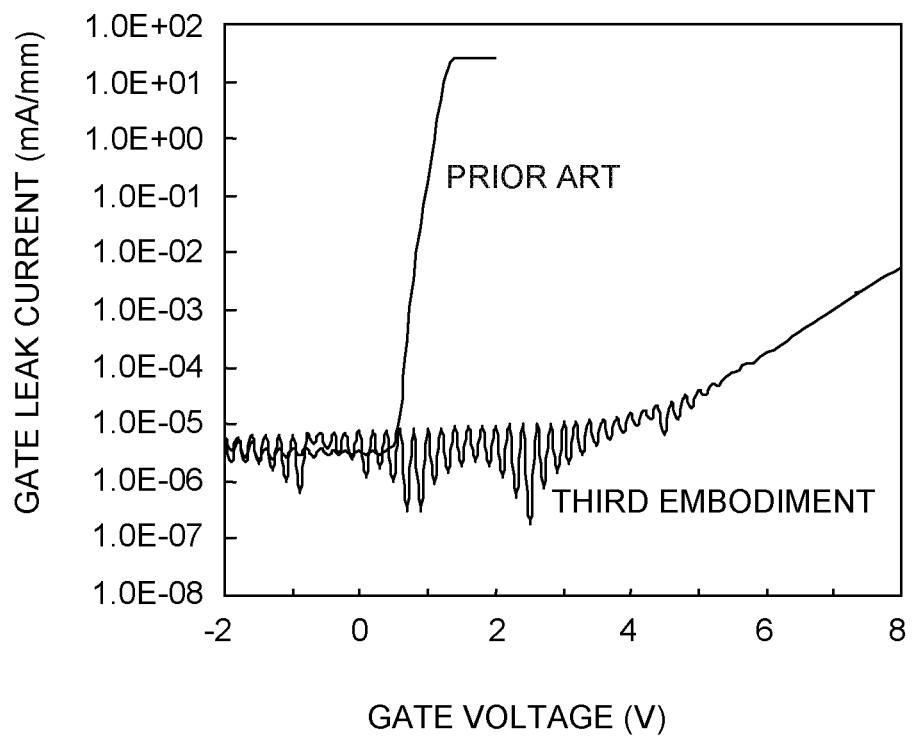
FIG. 11 is a graphic chart showing a device characteristic of the compound semiconductor device according to the third embodiment of the present invention.

Here, a device characteristic of the compound semiconductor device manufactured by the present inventor in accordance with the above-stated method is described. FIG. 11 is a graphic chart showing the device characteristic of the compound semiconductor device according to the third embodiment measured by the present inventor. In FIG. 11, a device characteristic of the conventional compound semiconductor device shown in FIG. 1 is also shown for the purpose of reference. A horizontal axis is a gate voltage, and a vertical axis is a forward gate leak current. As shown in FIG. 11, the forward gate leak current is reduced in the third embodiment compared to the conventional compound semiconductor device. Namely, in the third embodiment, the gate leak current scarcely flows even when the gate voltage is increased up to approximately 4 V.

Besides, device characteristics (a threshold voltage Vth, a variation thereof $\sigma_{Vth}$ and a maximum current Imax) of the compound semiconductor device manufactured by the present inventor in accordance with the above-stated method are shown in Table 1. In Table 1, device characteristics of the conventional compound semiconductor device shown in FIG. 1 are also shown for the purpose of reference. Although, the threshold voltage Vth is a negative value in the conventional compound semiconductor device, the threshold voltage Vth is a positive value in the third embodiment. Besides, the variation $\sigma_{Vth}$ of the threshold voltage in the third embodiment is approximately 1/10 of the conventional compound semiconductor device. This is because it is possible to form the structure in the vicinity of the gate electrode 39 with high reproducibility in the third embodiment, but the reproducibility is low in the conventional compound semiconductor device. Further, in the third embodiment, the maximum current Imax becomes extremely high compared to the conventional compound semiconductor device in accordance with the reduction of the gate leak current.

TABLE 1

|  | Third Embodiment | Prior Art |
|---|---|---|
| Vth | +0.1 V | −0.2 V |
| $\sigma_{Vth}$ | 30 mV | 300 mV |
| Imax | 650 mA/mm | 100 mA/mm |

Fourth Embodiment

Figure 12:
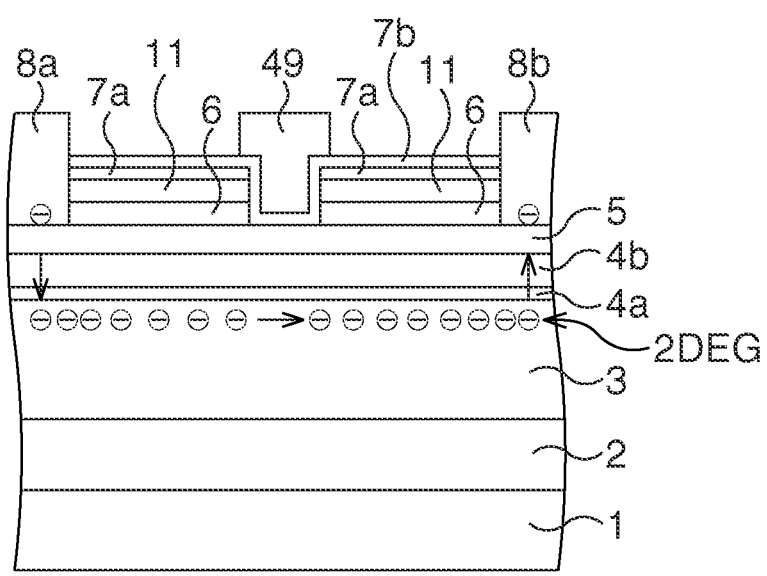
FIG. 12 is a sectional view showing a structure of a compound semiconductor device according to a fourth embodiment of the present invention.

Next, a fourth embodiment of the present invention is described. FIG. 12 is a sectional view showing a structure of a compound semiconductor device according to the fourth embodiment of the present invention.

In the fourth embodiment, an n-type GaN layer 11 with a thickness of approximately 7 nm is formed between the non-doped AlN layer 6 and the SiN layer 7a. The n-type GaN layer 11 is doped with Si at approximately $5 \times 10^{18}$ cm$^{-3}$. An opening similar to those of the non-doped AlN layer 6 and the SiN layer 7a are formed in the n-type GaN layer 11. The other structure is the same as the third embodiment. Incidentally, a doping amount of Si in the n-type GaN layer 11 may be higher than that of the n-type GaN layer 5.

According to the fourth embodiment as stated above, the n-type GaN layer 11 is formed on the non-doped AlN layer 6, and therefore, a chemical change of the non-doped AlN layer 6 hardly occurs. Accordingly, deterioration of a whole device hardly occurs, and a high reliability can be obtained.

Incidentally, when the compound semiconductor device according to the fourth embodiment is manufactured, for example, the n-type GaN layer 11 is formed on the non-doped AlN layer 6 between the formation of the non-doped AlN layer 6 and the formation of the SiN layer 7a. After the opening is formed in the SiN layer 7a, dry etching of the n-type GaN layer 11 is performed. This dry etching may be performed by a time control. Next, wet etching of the non-doped AlN layer 6 is performed as same as the first to third embodiments. At this time, the n-type GaN layer 5 positioning under the non-doped AlN layer 6 is not removed by the wet etching, and therefore, the etching is stopped at the surface of the n-type GaN layer 5.

Figure 13:
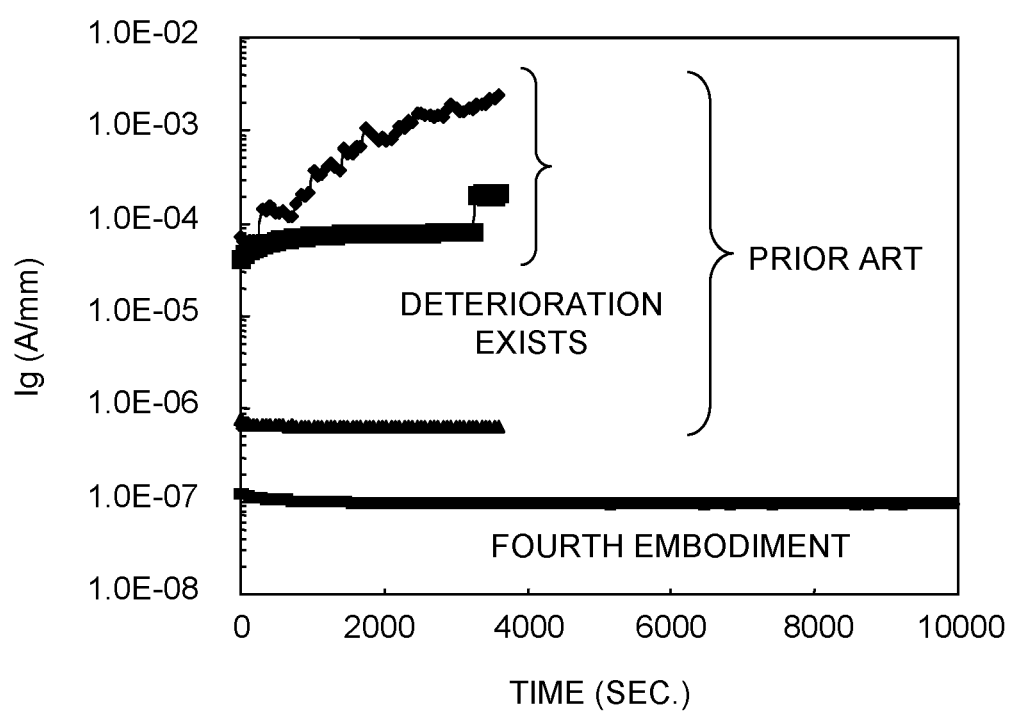
FIG. 13 is a graphic chart showing a test data of reliability of the compound semiconductor device according to the fourth embodiment of the present invention.

Here, a reliability of the compound semiconductor device manufactured by the present inventor in accordance with the above-stated method is described. FIG. 13 is a graphic chart showing a test data of the reliability of the compound semiconductor device according to the fourth embodiment measured by the present inventor. In FIG. 13, test data (three kinds) of the conventional compound semiconductor device shown in FIG. 1 are shown for the purpose of reference. A horizontal axis is test time, and a vertical axis is a gate leak current Ig. As shown in FIG. 13, the gate leak currents are high even at a test start time, and the gate leak currents increase as the time elapses depending on samples, in the conventional compound semiconductor device. This shows that the deterioration is in progress. On the other hand, in the fourth embodiment, the gate leak current at the test start time is low, and further, the increase in accordance with the elapsed time is not observed at all.

Fifth Embodiment

Figure 14:
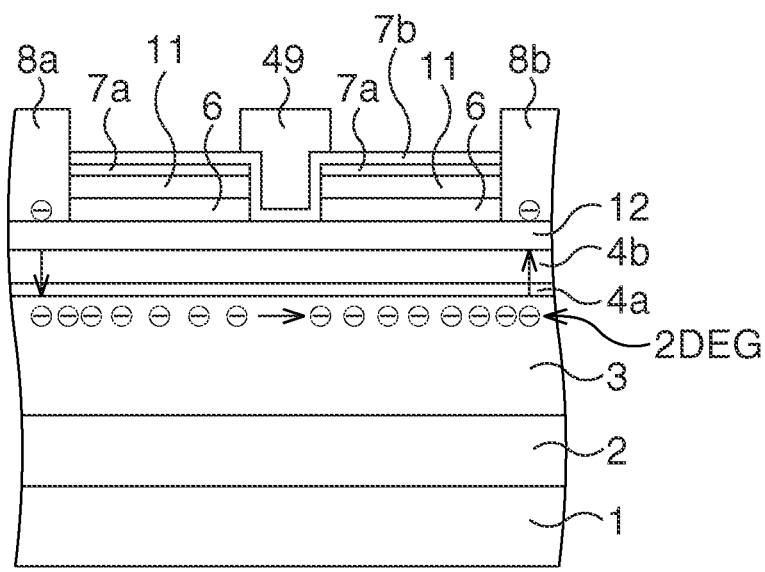
FIG. 14 is a sectional view showing a structure of a compound semiconductor device according to a fifth embodiment of the present invention.

Next, a fifth embodiment of the present invention is described. FIG. 14 is a sectional view showing a structure of a compound semiconductor device according to the fifth embodiment.

In the fifth embodiment, a non-doped GaN layer 12 is formed instead of the n-type GaN layer 5 in the fourth embodiment.

According to the fifth embodiment as stated above, the non-doped GaN layer 12 is used instead of the n-type GaN layer 5, and therefore, the gate leak current can be reduced further more. Besides, the MIS structure is adopted as same as the third embodiment, and therefore, the characteristics may not deteriorate even if the non-doped GaN layer 12 is used.

Sixth Embodiment

Figure 15:
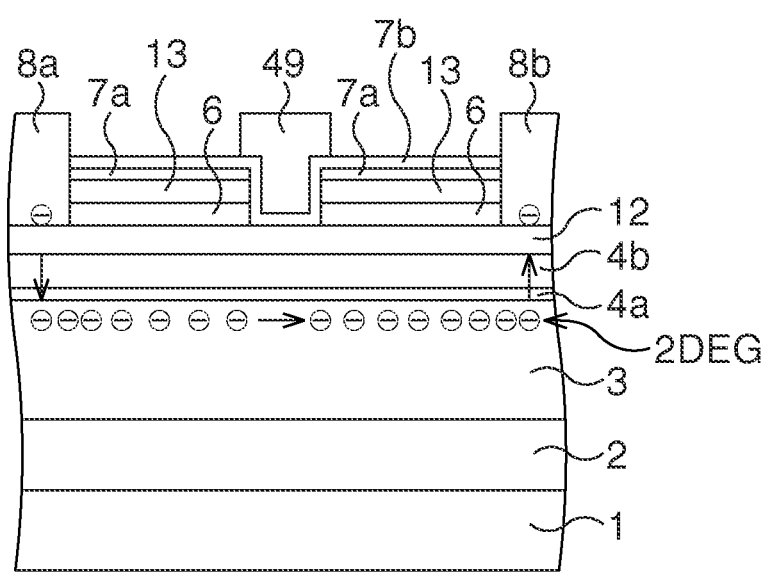
FIG. 15 is a sectional view showing a structure of a compound semiconductor device according to a sixth embodiment of the present invention.

Next, a sixth embodiment of the present invention is described. FIG. 15 is a sectional view showing a structure of a compound semiconductor device according to the sixth embodiment of the present invention.

In the sixth embodiment, an n-type InGaN layer 13 is formed instead of the n-type GaN layer 11 in the fifth embodiment.

According to the sixth embodiment as stated above, the n-type InGaN layer 13 is used instead of the n-type GaN layer 11, and therefore, a band in this layer decreases, and the two-dimensional electron gas increases. As a result, the maximum current increases.

Seventh Embodiment

Figure 16:
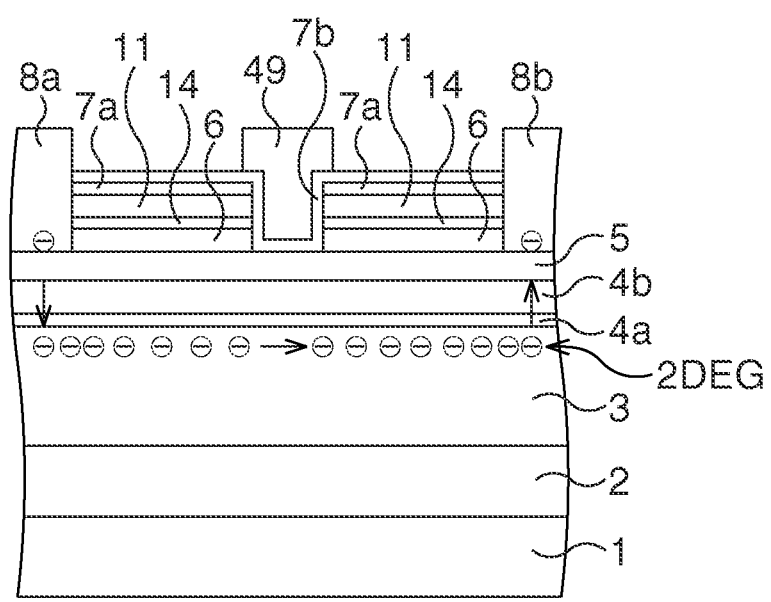
FIG. 16 is a sectional view showing a structure of a compound semiconductor device according to a seventh embodiment of the present invention.

Next, a seventh embodiment of the present invention is described. FIG. 16 is a sectional view showing a structure of a compound semiconductor device according to the seventh embodiment of the present invention.

In the seventh embodiment, an Si layer 14 for one atomic layer is formed between the non-doped AlN layer 6 and the n-type GaN layer 11 in the fourth embodiment. The Si layer 14 may be formed by, for example, a planer doping method (an atomic layer doping method).

According to the seventh embodiment as stated above, resistance between electrodes decreases, and the maximum current increases. Incidentally, the Si layer 14 may be formed between the n-type GaN layer 5 and the non-doped AlN layer 6.

Incidentally, the formation of the AlN layer may be performed by an ALD (Atomic Layer Deposition) method, a sputtering method, or the like. In this case, a crystal orientation of the AlN layer is hardly affected by the GaN layer positioning under the AlN layer. Besides, in these embodiments, the AlN layer is formed between the gate electrode, the source electrode and the drain electrode as a compound semiconductor layer containing N, but another compound semiconductor layer, for example, a layer such as InAlN further containing In may be formed. Further, in these embodiments, it is described as a simple HEMT, but plural HEMT may be accumulated. In this case, the element isolation may be performed by, for example, the ion-implantation, a mesa etching, or the like.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

INDUSTRIAL APPLICABILITY

According to the present invention, a compound semiconductor layer containing N is formed on a protective layer, and a process of the compound semiconductor layer can be performed under a condition free from an influence on the protective layer. Accordingly, it is possible to construct a gate recess structure with high reproducibility. It is therefore possible to suppress current flowing when a gate voltage is made to be "0" (zero). Besides, it is possible to suppress a gate leak current to realize a high withstand voltage when an insulator layer is in contact with a side surface of a gate electrode.

What is claimed is:

1. A manufacturing method of a compound semiconductor device, comprising:
    forming a GaN based carrier transit layer over a substrate;
    forming a GaN based carrier supply layer over the carrier transit layer;
    forming a GaN based protective layer over the carrier supply layer;
    forming a compound semiconductor layer containing nitrogen over said protective layer;
    forming an insulator layer over the compound semiconductor layer;

forming an opening for a source electrode, an opening for a drain electrode and an opening for a gate electrode in the insulator layer and the compound semiconductor layer; and forming electrodes in the three openings, wherein said forming the opening for the gate electrode comprises:

forming a first opening in the insulator layer; and performing wet etching the compound semiconductor layer until the protective layer exposes so as to form a second opening in the compound semiconductor layer, the second opening being communicated with the first opening, and the protective layer being exposed through the first opening and the second opening.

2. The manufacturing method of a compound semiconductor device according to claim 1, wherein an SiN layer is formed as the insulator layer.

3. The manufacturing method of a compound semiconductor device according to claim 1, wherein an AlN layer is formed as the compound semiconductor layer.

4. The manufacturing method of a compound semiconductor device according to claim 1, further comprising forming a second insulator layer at a bottom portion and a side portion of the opening for the gate electrode, after said forming the opening for the gate electrode.

5. A manufacturing method of a compound semiconductor device, comprising:

forming a GaN based carrier transit layer over a substrate;

forming a GaN based carrier supply layer over the carrier transit layer;

forming a GaN based protective layer over the carrier supply layer;

forming a compound semiconductor layer containing nitrogen over said protective layer;

forming a GaN based second compound semiconductor layer over the compound semiconductor layer, forming an insulator layer over the second compound semiconductor layer;

forming an opening for a source electrode, an opening for a drain electrode and an opening for a gate electrode in the insulator layer, the second compound semiconductor layer, and the compound semiconductor layer; and forming electrodes in the three openings, wherein said forming the opening for the gate electrode comprises:

forming a first opening in the insulator layer; and performing wet etching the compound semiconductor layer until the protective layer exposes so as to form a second opening in the compound semiconductor layer, the second opening being communicated with the first opening, and the protective layer being exposed through the first opening and the second opening.

6. The manufacturing method of a compound semiconductor device according to claim 5, wherein a layer containing indium is formed as the second compound semiconductor layer.

7. The manufacturing method of a compound semiconductor device according to claim 5, further comprising forming a silicon layer by an atomic layer doping on the compound semiconductor layer, between said forming the compound semiconductor layer and said forming the second compound semiconductor layer.

* * * * *